United States Patent
Yi

(10) Patent No.: US 11,195,895 B2
(45) Date of Patent: Dec. 7, 2021

(54) FLEXIBLE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Shijuan Yi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 488 days.

(21) Appl. No.: 16/309,314

(22) PCT Filed: Oct. 10, 2018

(86) PCT No.: PCT/CN2018/109557
§ 371 (c)(1),
(2) Date: Dec. 12, 2018

(87) PCT Pub. No.: WO2020/051963
PCT Pub. Date: Mar. 19, 2020

(65) Prior Publication Data
US 2021/0225982 A1    Jul. 22, 2021

(30) Foreign Application Priority Data
Sep. 21, 2018 (CN) .......................... 201811059816.6

(51) Int. Cl.
*H01L 27/32* (2006.01)

(52) U.S. Cl.
CPC .. *H01L 27/3276* (2013.01); *H01L 2251/5338* (2013.01)

(58) Field of Classification Search
CPC .................... H01L 27/3276; H01L 2251/5338
See application file for complete search history.

(56) References Cited

U.S. PATENT DOCUMENTS

| | | | |
|---|---|---|---|
| 9,287,329 B1 * | 3/2016 | Lee | .......... H01L 27/1218 |
| 9,786,229 B2 * | 10/2017 | Lee | .......... G09G 3/3291 |
| 2016/0054832 A1 | 2/2016 | Kim et al. | |
| 2018/0212015 A1 | 7/2018 | Chen | |

FOREIGN PATENT DOCUMENTS

| | | |
|---|---|---|
| CN | 106597713 A | 4/2017 |
| CN | 106782122 A | 5/2017 |
| CN | 206178744 U | 5/2017 |
| CN | 107065336 A | 8/2017 |
| CN | 108010942 A | 5/2018 |
| CN | 108231839 A | 6/2018 |
| CN | 108363254 A | 8/2018 |

* cited by examiner

*Primary Examiner* — Kyoung Lee

(57) ABSTRACT

A flexible display panel is disclosed. A novel bending area is designed, and a portion of traces of a non-active area are bent to a back side of the display panel. Main driving power line VDD traces and driving power line VSS traces are designed to be located between the bending area and a distributed circuit area of the non-active area. Therefore, a full screen design with an ultra slim lower border of the flexible display panel may be realized without damaging a thin film package design of the flexible display panel.

14 Claims, 2 Drawing Sheets

FLEXIBLE DISPLAY PANEL

CROSS-REFERENCE TO RELATED APPLICATIONS

This application is a National Stage of International Application No. PCT/CN2018/109557, filed Oct. 10, 2018, which claims the benefit of and priority to Chinese Patent Application No. 201811059816.6, filed Sep. 21, 2018, the entireties of which are hereby incorporated herein by reference.

FIELD OF INVENTION

The present disclosure relates to a technical field of flexible display panels, and more particularly to a flexible display panel having a full screen design with an ultra slim lower border of the panel.

BACKGROUND OF INVENTION

Recently, rapid development of organic light emitting diode (OLED) display technologies has promoted fast entry of curved surface and flexible touch display products into the market. Relevant technologies also update with each passing day. OLEDs are diodes that use organic semiconductor material and light emitting material driven by electric fields to cause light emission through carrier injection and recombination.

Active matrix organic light emitting diodes (AMOLEDs) are originated from OLED display technologies. AMOLEDs have a characteristic of being self-luminous. AMOLEDs use very thin coatings of organic material and glass substrates, and when current passes through the organic material, the organic material emits light. AMOLED panels are self-luminous, and are different from thin film transistor liquid crystal displays (TFT-LCDs) that need backlights. Therefore, AMOLED panels have large viewing angles, high color saturation, particularly low driving voltage, and low power consumption, and are in addition, fast in response speed, lightweight, slim, structurally simple, and low cost, and are considered one of the most promising products.

FIG. 1 is a plan diagram of an AMOLED display panel in accordance with a related art. As illustrated in FIG. 1, a panel design of the AMOLED display panel uses a chip on film (COF) architecture. COF technologies are package technologies for fixing driving ICs to flexible circuit boards using flexible films. As illustrated in FIG. 1, driving power line VDD traces 004, and driving power line VSS traces 005 are routed out from a COF area 006, and enter the panel. For this type of AMOLED display panel design, a lower border is too wide to meet a full screen display design.

Therefore, realizing a full screen design with an ultra slim lower border of a flexible display panel without damaging a thin film package design of the flexible display panel is a problem to be solved.

SUMMARY OF INVENTION

An object of the present disclosure is to provide a flexible display panel that may realize a full screen design with an ultra slim lower border of the flexible display panel without damaging a thin film package design of the flexible display panel.

In order to achieve the above object, the present disclosure provides a flexible display panel. The flexible display panel includes: a data signal line, a first power line, an active area, and a non-active area. The non-active area includes: a bending area located below the active area, and a fanout trace area located below the bending area, and further includes a first trace changing area and a second trace changing area. The first trace changing area is disposed between the bending area and the active area. The second trace changing area is disposed between the fanout trace area and the bending area. A trace of the data signal line at the first trace changing area is changed into a source/drain (SD) layer metal trace, then the SD layer metal trace of the data signal line is routed to the bending area, and disposed at the bending area, a trace of the data signal line at the second trace changing area is changed into a molybdenum (Mo) layer metal trace, and then the Mo layer metal trace of the data signal line is routed to the fanout trace area The first power line routed from the active area to the bending area is disposed with a Mo layer metal trace, a trace of the first power line at the first trace changing area is changed into the SD layer metal trace, and then the SD layer metal trace of the first power line is routed to the bending area, and is disposed at the bending area.

In order to achieve the above object, the present disclosure also provides a flexible display panel. The flexible display panel includes: an active area and a non-active area, wherein the non-active area includes a bending area located below the active area, and a fanout trace area located below the bending area; a data signal line, wherein the data signal line at the bending area is disposed with a first metal layer trace, and the data signal line routed from the bending area to the fanout trace area is disposed with a second metal layer trace; and a first power line, wherein the first power line routed from the active area to the bending area is disposed with a second metal layer trace, and the first power line at the bending area is disposed with a first metal layer trace.

The present disclosure has the following advantages. A novel bending area is designed, and a portion of traces of a non-active area are bent to a back side of a display panel. Main driving power line VDD traces and driving power line VSS traces are designed to be located between the bending area and a distributed circuit area of the non-active area. Therefore, minimizing a lower border is facilitated. Hence, a full screen design with an ultra slim lower border of the flexible display panel may be realized without damaging a thin film package design of the flexible display panel. A flexible active matrix organic light emitting diode (AMOLED) display panel of the present disclosure is not only suitable for a chip on plastic+flexible printed circuit (COP+FPC) architecture, but is also suitable for a chip on film (COF) architecture.

DESCRIPTION OF DRAWINGS

In order to describe a technical solution in embodiments or existing technology more clearly, drawings required to be used by the embodiments are briefly introduced below. Obviously, the drawings in the description below are only some embodiments of the present disclosure. With respect to persons of ordinary skill in the art, under a premise that inventive efforts are not made, other drawings may be obtained based on these drawings.

Figure 1:
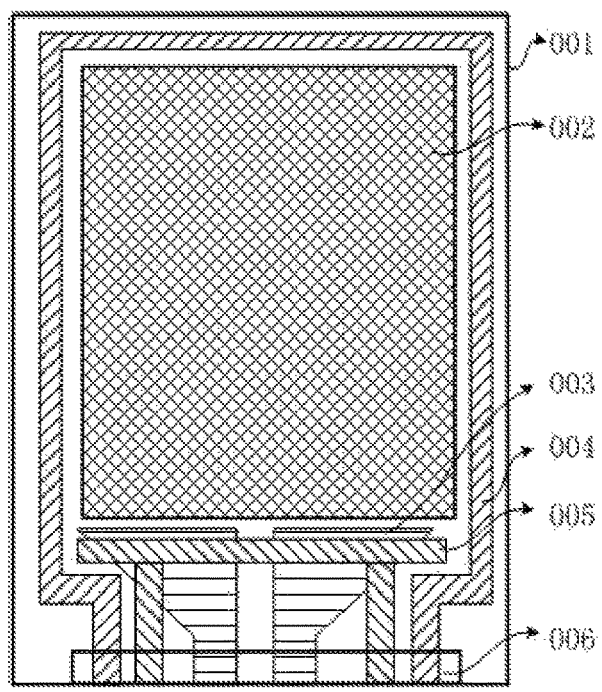
FIG. 1 is a plan diagram of an active matrix organic light emitting diode (AMOLED) display panel in accordance with a related art.

Labels in the figures are:
001: panel edge; 002: active area; 003: fanout trace area;
004: driving power line VDD traces; 005: driving power line VSS traces; 006: chip on film (COF) area;
101: panel edge; 102: active area; 103: bending area; 104: fanout trace area;
105: trace path of data signal line (Vdata) at bending area;
106: trace path of first power line routed out from flexible printed circuit (FPC);
107: trace path of first power line at bending area;
108: trace path of second power line routed out from FPC;
109: trace path of second power line at bending area;
110: trace path of second power line at panel end; 111: trace path of second power line at panel end;
112: integrated circuit (IC); 113: FPC; 114: first trace changing area; 115: second trace changing area; 110: third trace changing area;
117: package area; 118: second metal layer trace; 119: first metal layer trace;
120: source/drain (SD) layer metal trace;
121: data signal line of active area; 122: first power line of active area; 41: COF.

DETAILED DESCRIPTION OF PREFERRED EMBODIMENTS

Embodiments of the present disclosure are described in detail below and examples of the embodiments are illustrated in the accompanying drawings, wherein same or similar labels throughout the present disclosure represent corresponding same or similar elements or corresponding elements having same or similar functions. The description of the embodiments with reference to the accompanying drawings below is exemplary, aims at illustrating the present disclosure, and cannot be considered as limitations to the present disclosure.

In the present disclosure, unless otherwise definitely specified and defined, when a first feature is "over" or "under" a second feature, the first feature may be directly in contact with the second feature, or the first feature and the second feature may not be directly in contact with each other and may be in contact through another feature between the first feature and the second feature. Furthermore, when the first feature is "over", "above", or "upper than" the second feature, the first feature may be directly above or obliquely above the second feature, or the phrase may merely mean that a level of the first feature is higher than a level of the second feature. When the first feature is "under", "below", or "lower than" the second feature, the first feature may be directly below or obliquely below the second feature, or the phrase may merely mean that a level of the first feature is lower than a level of the second feature.

The publication of the following description provides many different embodiments or examples for implementing different structures of the present disclosure. In order to simplify the publication of the present disclosure, in the following description, components and configurations of particular examples are described. Of course, they are only examples, and do not aim at limiting the present disclosure. In addition, the present disclosure may repeat reference numerals and/or reference letters in different examples. The repetition is for the purposes of simplicity and clarity, and the repetition itself does not indicate relationships between methods and/or configurations of various embodiments. Furthermore, the present disclosure provides various particular process and material examples, but those of ordinary skill in the art may think of application of other processes and/or use of other material.

Figure 2:
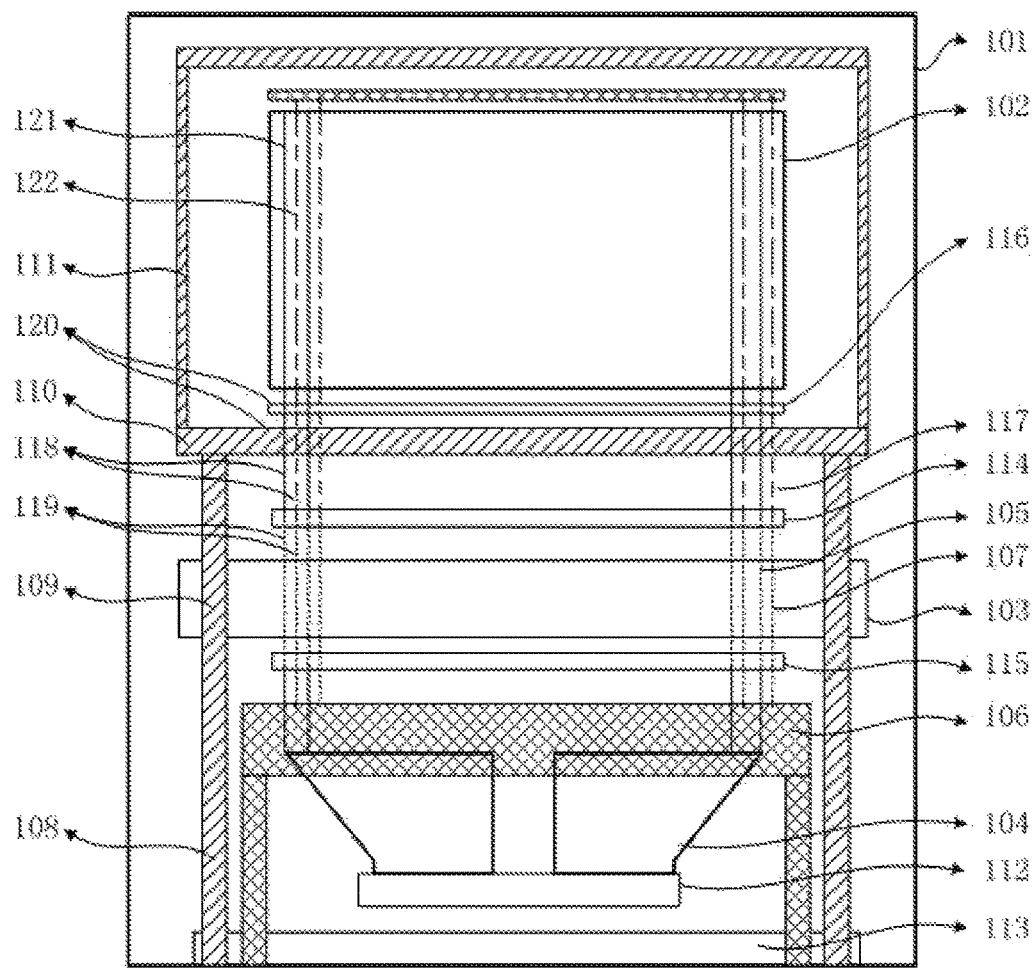
FIG. 2 is a plan diagram of a flexible display panel in accordance with an embodiment of the present disclosure.
Figure 3:
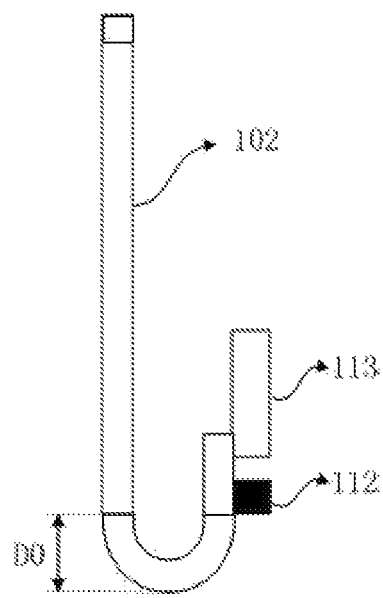
FIG. 3 is a side-view diagram illustrating a bending form of the flexible display panel described with reference to FIG. 2.

Referring to FIGS. 2 and 3, FIG. 2 is a plan diagram of a flexible display panel in accordance with an embodiment of the present disclosure, and FIG. 3 is a side-view diagram illustrating a bending form of the flexible display panel described with reference to FIG. 2. Dashed lines in the figure are used to schematically illustrate trace designs of different areas, and are not used to illustrate virtually open circuit connections. In the present embodiment, the flexible display panel uses a chip on plastic+flexible printed circuit (COP+FPC) architecture. The flexible display panel includes: an active area 102 and a non-active area, wherein the non-active area includes a bending area 103 located below the active area 102, and a fanout trace area 104 located below the bending area 103; a data signal line, wherein the data signal line at the bending area 103 is disposed with a first metal layer trace 119, and the data signal line routed from the bending area 103 to the fanout trace area 104 is disposed with a second metal layer trace 118; and a first power line, wherein the first power line routed from the active area 102 to the bending area 103 is disposed with a second metal layer trace 118, and the first power line at the bending area 103 is disposed with a first metal layer trace 119.

The first metal layer trace 119 is a source/drain (SD) layer metal trace, and the second metal layer trace 118 is a molybdenum (Mo) layer metal trace.

By bending the bending area 103, a portion of the non-active area may be bent to a back side of the flexible display panel, realizing a full screen design with an ultra slim lower border of the flexible display panel. As illustrated in FIG. 3, for the bent flexible display panel, an integrated circuit (IC) 112 and a flexible printed circuit (FPC) 113 are both placed at a back side of the active area 102. A width DO of the lower border is 2.0 mm. Minimizing the low border may be realized.

For the flexible display panel of the present disclosure, the novel bending area is designed, and a portion of traces of the non-active area are bent to the back side of the display panel. Therefore, the full screen design with the ultra slim lower border of the flexible display panel may be realized.

Preferably, the non-active area further includes: a first trace changing area 114 disposed between the bending area 103 and the active area 102, wherein a corresponding trace of each of the data signal line (Vdata) and the first power line at the first trace changing area 114 is changed into the corresponding first metal layer trace 119, and then the corresponding first metal layer trace 119 of each of the data signal line and the first power line is routed to the bending area 103; a second trace changing area 115 disposed between the fanout trace area 104 and the bending area 103, wherein a trace of the data signal line at the second trace changing area 115 is changed into the second metal layer trace, and then the second metal layer trace of the data signal line is routed to the fanout trace area 104. That is, before each of the metal traces enters the bending area 103 from the active area 102, each of the metal traces at the first trace changing area 114 is changed into the first metal layer trace 119 (if any of the metal traces is originally the first metal layer trace 119, then the metal trace does not need to be changed), to reduce damage to the panel due to bending. After passing by the bending area 103, the trace of the data signal line at the second trace changing area 115 is changed into the second metal layer trace 118, and the data signal line passes by the fanout trace area 104 and is routed to the IC in the non-active area.

Further, the non-active area further includes: a third trace changing area 116 disposed between the first trace changing area 114 and the active area 102, wherein a trace of the first power line at the third trace changing area 116 is changed into the second metal layer trace 118, and then the second metal layer trace of the first power line is routed to the first trace changing area 114. By compressing the first power line at the third trace changing area 116 such that the first power line at the third trace changing area 116 is the narrowest, the lower border may be further made narrower. The trace of the first power line at the third trace changing area 116 is changed into the second metal layer trace 118. Therefore, at a package area 117 of the flexible display panel, each trace of the data signal line and the first power line is the second metal layer trace 118, which may improve water and oxygen resisting capability of the flexible display panel. A portion located between the first trace changing area 114 and the third trace changing area 116 in the non-active area as illustrated in the figure is covered by a package layer, but the package area of the flexible display panel includes not only the portion.

In the present embodiment, the first power line is driving power line VDD traces. The VDD traces are routed out from the FPC 113, pass by the second trace changing area 115, the bending area 103, and the first trace changing area 114 (as illustrated by trace paths indicated by reference numerals 106 and 107 in FIG. 2), and are shorted together at the third trace changing area 116, to provide a voltage driving signal VDD for the active area 102. Therefore, panel uniformity is improved.

Preferably, the flexible display panel further includes: a second power line routed out from the FPC 113, passing by the bending area 103, and becoming traces surrounding the active area 102. In the present embodiment, the second power line is driving power line VSS traces. VSS traces 108 are routed out from the FPC 113, the VSS traces further pass by the bending area 103, and then enter the display panel, to provide a voltage switch signal VSS (as illustrated by trace paths indicated by reference numerals 109, 110, and 111 in FIG. 2).

For the flexible display panel of the present disclosure, main driving power line VDD traces and driving power line VSS traces are designed to be located between the bending area 103 and COP+FPC, as illustrated by trace paths indicated by reference numerals 106 and 108. Therefore, minimizing the lower border may be facilitated without damaging the thin film package design of the flexible display panel, realizing the full screen design with the ultra slim lower border of the flexible display panel.

Figure 4:
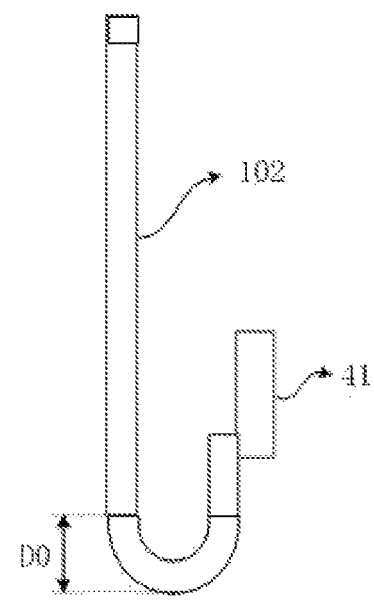
FIG. 4 is a side-view diagram illustrating a bending form of the flexible display panel in accordance with another embodiment of the present disclosure.

Referring to FIG. 4, FIG. 4 is a side-view diagram illustrating a bending form of the flexible display panel in accordance with another embodiment of the present disclosure. A difference between the present embodiment and the embodiment described with reference to FIG. 3 is that the flexible display panel in accordance with the present embodiment uses a chip on film (COF) architecture. For the bent flexible display panel, a COF 41 is placed at the back side of the active area 102. The width DO of the lower border is 2.0 mm. Minimizing the low border may be realized. A panel design of the flexible display panel in accordance with the present embodiment is similar to FIG. 2, and is omitted here.

The flexible display panel of the present disclosure may be a flexible active matrix organic light emitting diode (AMOLED) display panel.

For the flexible display panel of the present disclosure, the novel bending area is designed, and the portion of the traces of the non-active area are bent to the back side of the display panel. Therefore, the full screen design with the ultra slim lower border of the flexible display panel may be realized. The main driving power line VDD traces and driving power line VSS traces are designed to be located between the bending area and a distributed circuit area of the non-active area. Therefore, minimizing the lower border may be facilitated without damaging the thin film package design of the flexible display panel. The flexible display panel of the present disclosure is not only suitable for the COP+FPC architecture, but is also suitable for the COF architecture.

INDUSTRIAL UTILITY

The subject matter of the present application may be manufactured and used in industry, and satisfies the industrial utility requirement.

What is claimed is:

1. A flexible display panel, wherein
the flexible display panel comprises: a data signal line, a first power line, an active area, and a non-active area;
the non-active area comprises: a bending area located below the active area, and a fanout trace area located below the bending area, and further comprises a first trace changing area and a second trace changing area;
the first trace changing area is disposed between the bending area and the active area;
the second trace changing area is disposed between the fanout trace area and the bending area;
a trace of the data signal line at the first trace changing area is changed into a source/drain (SD) layer metal trace, then the SD layer metal trace of the data signal line is routed to the bending area, and disposed at the bending area, a trace of the data signal line at the second trace changing area is changed into a molybdenum (Mo) layer metal trace, and then the Mo layer metal trace of the data signal line is routed to the fanout trace area; and
the first power line routed from the active area to the bending area is disposed with a Mo layer metal trace, a trace of the first power line at the first trace changing area is changed into the SD layer metal trace, and then the SD layer metal trace of the first power line is routed to the bending area, and is disposed at the bending area.

2. The flexible display panel of claim 1, wherein the non-active area further comprises:
a third trace changing area disposed between the first trace changing area and the active area, wherein a trace of the first power line at the third trace changing area is changed into the Mo layer metal trace, and then the Mo layer metal trace of the first power line is routed to the first trace changing area.

3. The flexible display panel of claim 1, wherein the flexible display panel further comprises:
a second power line routed out from a flexible printed circuit (FPC), passing by the bending area, and becoming traces surrounding the active area.

4. The flexible display panel of claim 1, wherein the flexible display panel uses a chip on plastic+flexible printed circuit (COP+FPC) architecture.

5. The flexible display panel of claim 1, wherein the flexible display panel uses a chip on film (COF) architecture.

6. The flexible display panel of claim 1, wherein the flexible display panel is a flexible active matrix organic light emitting diode (AMOLED) display panel.

7. A flexible display panel, wherein the flexible display panel comprises:
- an active area and a non-active area, wherein the non-active area comprises a bending area located below the active area, and a fanout trace area located below the bending area;
- a data signal line, wherein the data signal line at the bending area is disposed with a first metal layer trace, and the data signal line routed from the bending area to the fanout trace area is disposed with a second, metal layer trace; and
- a first power line, wherein the first power line routed from the active area to the bending area is disposed with a second metal layer trace, and the first power line at the bending area is disposed with a first metal layer trace.

8. The flexible display panel of claim 7, wherein the first metal layer trace is a source/drain (SD) layer metal trace, and the second metal layer trace is a molybdenum (Mo) layer metal trace.

9. The flexible display panel of claim 7, wherein the non-active area further comprises:
- a first trace changing area disposed between the bending area and the active area, wherein a corresponding trace of each of the data signal line and the first power line at the first trace changing area is changed into the corresponding first metal layer trace, and then the corresponding first metal layer trace of each of the data signal line and the first power line is routed to the bending area; and
- a second trace changing area disposed between the fanout trace area and the bending area, wherein a trace of the data signal line at the second trace changing area is changed into the second metal layer trace, and then the second metal layer trace of the data signal line is routed to the fanout trace area.

10. The flexible display panel of claim 9, wherein the non-active area further comprises:
- a third trace changing area disposed between the first trace changing area and the active area, wherein a trace of the first power line at the third trace changing area is changed into the second metal layer trace, and then the second metal layer trace of the first power line is routed to the first trace changing area.

11. The flexible display panel of claim 7, wherein the flexible display panel further comprises:
- a second power line routed out from a flexible printed circuit (FPC), passing by the bending area, and becoming traces surrounding the active area.

12. The flexible display panel of claim 7, wherein the flexible display panel uses a chip on plastic+flexible printed circuit (COP+FPC) architecture.

13. The flexible display panel of claim 7, wherein the flexible display panel uses a chip on film (COF) architecture.

14. The flexible display panel of claim 7, wherein the flexible display panel is a flexible active matrix organic light emitting diode (AMOLED) display panel.

* * * * *